(12) United States Patent
Cheng et al.

(10) Patent No.: US 9,093,564 B2
(45) Date of Patent: Jul. 28, 2015

(54) INTEGRATED PASSIVE DEVICES FOR FINFET TECHNOLOGIES

(71) Applicant: INTERNATIONAL BUSINESS MACHINES CORPORATION, Armonk, NY (US)

(72) Inventors: Kangguo Cheng, Schenectady, NY (US); Thomas N. Adam, Slingerlands, NY (US); Balasubramanian Pranatharthi Haran, Watervliet, NY (US); Shom Ponoth, Clifton Park, NY (US); Theodorus E. Standaert, Clifton Park, NY (US); Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 38 days.

(21) Appl. No.: 13/847,669

(22) Filed: Mar. 20, 2013

(65) Prior Publication Data

US 2014/0284760 A1    Sep. 25, 2014

(51) Int. Cl.
*H01L 21/20* (2006.01)
*H01L 21/84* (2006.01)
*H01L 27/12* (2006.01)

(52) U.S. Cl.
CPC .............. *H01L 21/84* (2013.01); *H01L 21/845* (2013.01); *H01L 27/1211* (2013.01)

(58) Field of Classification Search
None
See application file for complete search history.

(56) References Cited

U.S. PATENT DOCUMENTS

| 5,952,695 | A | 9/1999 | Ellis-Monaghan et al. | |
|---|---|---|---|---|
| 6,969,891 | B1 | 11/2005 | Leroux | |
| 7,148,543 | B2 | 12/2006 | Yamada et al. | |
| 7,741,679 | B2 | 6/2010 | Yamaguchi et al. | |
| 7,800,111 | B2 | 9/2010 | Lin et al. | |
| 2006/0055027 | A1* | 3/2006 | Kitabatake et al. | 257/706 |
| 2008/0315315 | A1* | 12/2008 | Mathew et al. | 257/365 |
| 2010/0038689 | A1 | 2/2010 | Ahn et al. | |
| 2011/0024840 | A1* | 2/2011 | Khater | 257/347 |
| 2012/0014069 | A1* | 1/2012 | Zeng et al. | 361/718 |

FOREIGN PATENT DOCUMENTS

CN          1967793 A        5/2007

\* cited by examiner

*Primary Examiner* — Thomas L Dickey
*Assistant Examiner* — Herve Assouman
(74) *Attorney, Agent, or Firm* — Steven Meyers; Roberts Mlotkowski Safran & Cole, P.C.

(57) ABSTRACT

Integrated passive devices for silicon on insulator (SOI) Fin-FET technologies and methods of manufacture are disclosed. The method includes forming a passive device on a substrate on insulator material. The method further includes removing a portion of the insulator material to expose an underside surface of the substrate on insulator material. The method further includes forming material on the underside surface of the substrate on insulator material, thereby locally thickening the substrate on insulator material under the passive device.

18 Claims, 4 Drawing Sheets

INTEGRATED PASSIVE DEVICES FOR FINFET TECHNOLOGIES

FIELD OF THE INVENTION

The invention relates to semiconductor structures and, more particularly, to integrated passive devices for silicon on insulator (SOI) FinFET technologies and methods of manufacture.

BACKGROUND

Passive devices can be formed on BULK substrates or with Silicon-On-Insulator (SOI) technologies. In any of these scenarios, the passive devices can be formed with active devices, on a semiconductor substrate. The passive devices can be, for example, electrostatic discharge (ESD) diodes, resistors, capacitors, etc. Diodes can be used, for example, to block the current in one direction, and allow current to flow in the other direction. There are many different types of diodes including rectifier diodes, detector diodes, zener diodes, etc., all of which can be fabricated using semiconductor processes.

SUMMARY

In one or more embodiments of the invention, a method comprises forming a passive device on a substrate on insulator material. The method further comprises removing a portion of the insulator material to expose an underside surface of the substrate on insulator material. The method further comprises forming material on the underside surface of the substrate on insulator material, thereby locally thickening the substrate on insulator material under the passive device.

In one or more embodiments of the invention, a method comprises forming at least one passive device and at least one active device on a silicon on insulator substrate. The method further comprises removing a portion of insulator material under the at least one passive device to expose a surface of the silicon on insulator substrate, while protecting the at least one active device. The method further comprises epitaxially growing Si based material on the exposed surface of the silicon on insulator substrate. The method further comprises flowing insulator material over exposed surfaces of the epitaxially grown Si based material, the at least one passive device and the at least one active device.

In one or more embodiments of the invention, a method comprises forming at least one passive device, and increasing heat dissipation of a substrate material under the at least one passive device by locally thickening the substrate material with additional substrate material from an underside surface of the substrate material.

In one or more embodiments of the invention, a structure comprises a passive device formed on a silicon on insulator substrate which is locally thickened under the passive device by an epitaxially grown Si material on an underside surface of the silicon on insulator substrate. The structure further comprises flowable oxide in contact with the epitaxially grown Si material and the passive device.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the integrated passive structures which comprises the structures of the present invention. In still further embodiments, a method in a computer-aided design system is provided for generating a functional design model of the integrated passive structures. The method comprises generating a functional representation of the structural elements of the integrated passive structures.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to integrated passive devices for silicon on insulator (SOI) FinFET technologies and methods of manufacture. More specifically, the present invention provides a method for locally thickening a layer of semiconductor material under passive devices in SOI FinFET technologies. Advantageously, the locally thickened layer of material can provide improved thermal dissipation for the passive devices, thereby increasing efficiency of the passive devices. In embodiments, the passive devices can be, for example, ESD diodes; although other passive devices are also contemplated by the present invention, e.g., resistors, capacitors, fibers, lenses, etc.

In more specific embodiments, the methods of the present invention include forming active and passive devices on a substrate, e.g., SOI. The methods of the present invention further include recessing, e.g., removing, portions of a buried oxide layer (BOX) under the passive devices to expose a Si layer, which forms part of the passive devices. A semiconductor material is epitaxially grown within the recess in order to locally thicken the Si layer under the passive devices. The epitaxial material can be, for example, Si material, which is an excellent conductor of heat. In embodiments, a flowable oxide is deposited within any remaining portions of the recess and over the passive devices. In embodiments, active devices can also be provided on the substrate, in which case the flowable oxide can be deposited on the active devices.

Figure 1:
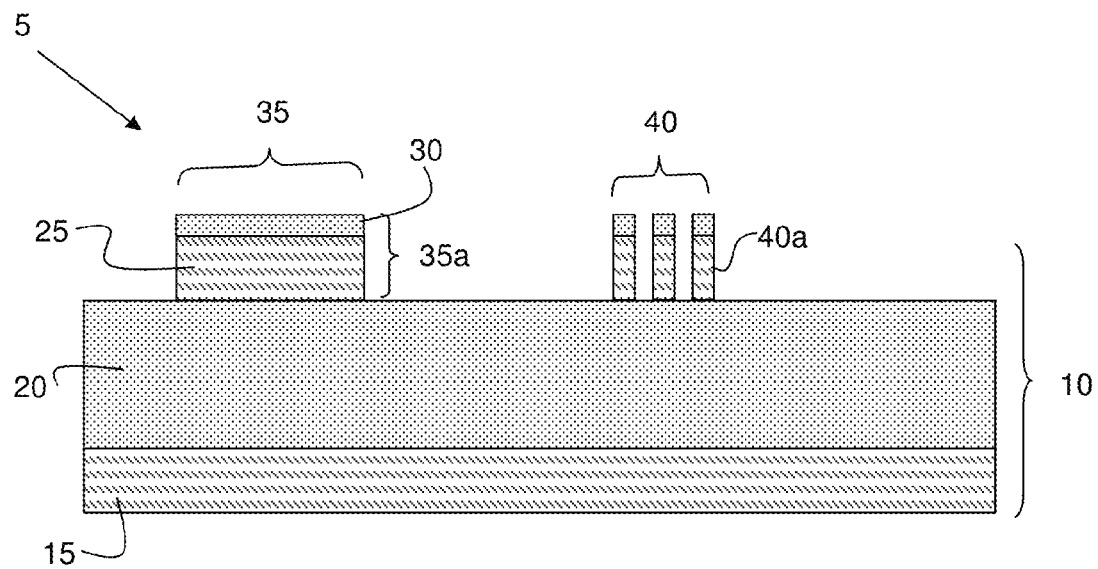
FIGS. 1-4 show processing steps and respective structures in accordance with aspects of the present invention.

FIG. 1 shows a beginning structure and respective processing steps in accordance with aspects of the present invention. In particular, the structure 5 includes a silicon on insulator substrate 10. In embodiments, the silicon on insulator substrate 10 includes a buried oxide layer (BOX) 20 formed over a silicon substrate 15. A silicon on insulator layer 25 is formed on the BOX 20. In a non-limiting example, the silicon on insulator layer 25 can be any semiconductor material such as, for example, Si, SiGe, Ge, GaAs, as well as other III/V or II/IV compound semiconductors or any combinations thereof. In embodiments, the silicon on insulator layer 25 can have a thickness of about 30 nm to 40 nm; although other dimensions are also contemplated by the present invention.

As should be understood by those of ordinary skill in the art, the substrate 10 can be fabricated using any known processes such as, for example, SiMOX, bonding techniques, etc.

Still referring to FIG. 1, a hardmask material 30 is formed over layer 25. In embodiments, the hardmask material 30 can be, for example, oxide or SiN, deposited to a thickness of about 3 nm to 10 nm; although other dimensions are also contemplated by the present invention. The hardmask material 30 can be deposited using, for example, a thermal oxidation process or other conventional deposition process (e.g., chemical vapor deposition (CVD)). The hardmask material 30 and layer 25 are patterned to form structures 35a in passive device regions 35 and fins 40a in active device regions 40. As should be understood by those of skill in the art, the structures 35a are used to form passive devices. In embodiments, and as non-limiting examples, the passive devices can be electrostatic discharge (ESD) diodes; whereas, active devices 40 comprise a plurality of fins 40a (FinFETs).

In embodiments, the structures 35a within the passive device regions 35 can be formed by conventional lithography and etching processes. For example, a resist can be formed over the hardmask material 30, which is exposed to energy, e.g., light, to form a pattern (opening). The hardmask material 30 and layer 25 can then be patterned using a conventional etching process, e.g., reactive ion etching (RIE), to form the structures 35a. The resist can be removed using conventional oxygen ashing processes. In embodiments, the structures 35a can have a width of about 40 nm to a few microns; although other dimensions are also contemplated by the present invention.

In further embodiments, the fins 40a within the active device regions 40 can be formed using conventional sidewall image transfer techniques. For example, a sacrificial material can be formed over the hardmask material 30, and patterned to form a plurality of sacrificial mandrels. Sidewalls, e.g., nitride sidewalls, can be formed on the sacrificial mandrels using conventional deposition processes. The sacrificial mandrels can be removed by a selective etching process, which leaves the sidewalls intact. An etching process, e.g., RIE, is then performed to form the plurality of fins 40a within the active device regions 40. The sidewalls can be removed using conventional stripping processes.

Figure 2:
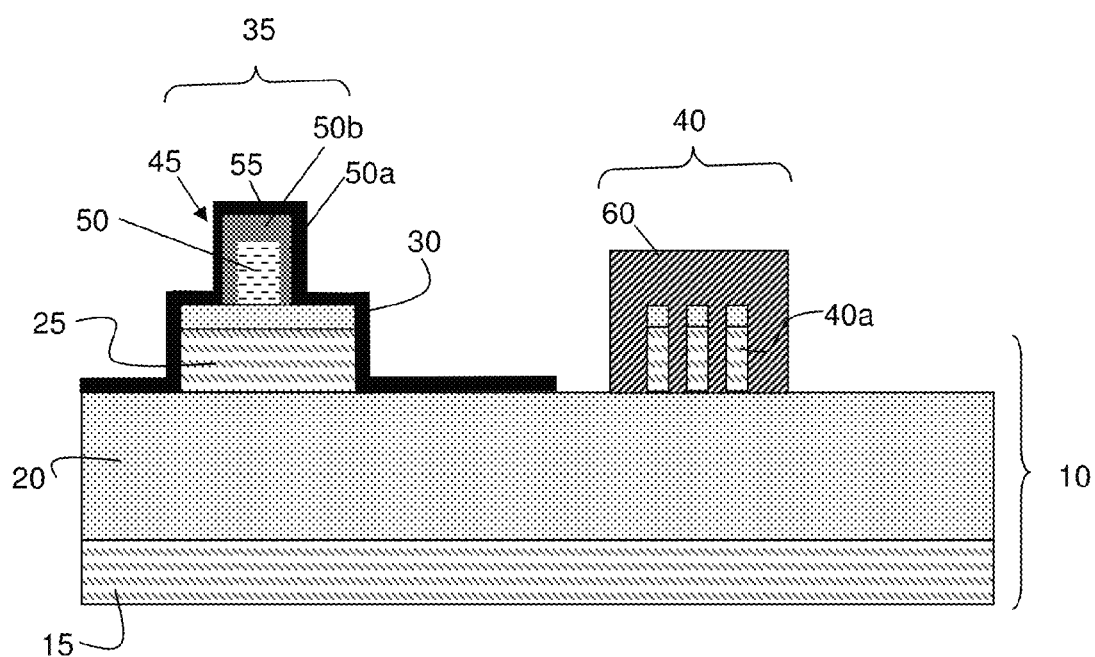

In FIG. 2, the remaining portions of a passive device 45, e.g., ESD diode, can be formed by patterning materials on the structure 35a. For example, in embodiments, the passive device 45 comprises a dummy material 50 with nitride sidewalls 50a and a nitride cap 50b, and covered with a nitride liner 55. In embodiments, the dummy material 50 is a poly material. Also, in FIG. 2, the fins 40a of the active device regions 40 can be merged together with epitaxial material 60, e.g., Si or SiC or SiGe.

In the fabrication processes, the passive device 45 can be fabricated using conventional lithography, etching and deposition methods. For example, the passive device(s) 45 can be formed by depositing the dummy material 50 (e.g., poly material) over a surface of the passive device regions 35, e.g., on the structure 35a, as well as on the active device regions 40 and any exposed oxide material 20. A nitride material is then deposited on the dummy material 50. The dummy material 50 and the nitride material then undergo an etching process in order to remove these materials within the active device regions 40, while patterning these materials in the passive device regions 35. In embodiments, the nitride material can form the nitride cap 50b on the passive device(s) 45. Nitride material is then deposited on the patterned structure to form sidewall spacers 50a on the passive device(s) 45. A nitride layer 55 is then blanket deposited using conventional deposition processes, e.g., Plasma Enhanced Chemical Vapor Deposition (PECVD), to a thickness of about 3 nm; although other dimensions are contemplated by the present invention.

After blanket deposition, the nitride layer 55 is removed from the active device regions 40 using a conventional lithography and etching process. For example, a resist can be formed over the passive device regions 35 to protect the nitride material during an etching process. The resist is exposed to light to form a pattern, e.g., opening over the active device regions 40, and the nitride material 55 is then removed from the active device regions 40 by conventional RIE processes. The resist can then be removed using a conventional oxygen ashing process.

On the other hand, to merge the fins 40a in the active device regions 40, an epitaxial material 60 can be grown over the fins 40a. In embodiments, the nitride layer 55 will protect the passive device 45 during the growth of the epitaxial material 60. That is, the nitride layer 55 will prevent epitaxial material 60 from growing in the passive device regions 35, during the merging process. In embodiments, the epitaxial material 60 can be, for example, Si, SiC or SiGe. For example, SiC can be used for NFETs; whereas, SiGe can be used for PFETs. In this way, the epitaxial material 60 can create a tensile strain on the NFETs and a compressive strain on the PFETs, thereby increasing the performance characteristics of the FETs. Conventional implantation and annealing processes can also be performed to form the NFETs and PFETs, such that no further explanation is needed for one of skill in the art to practice the invention.

Figure 3:
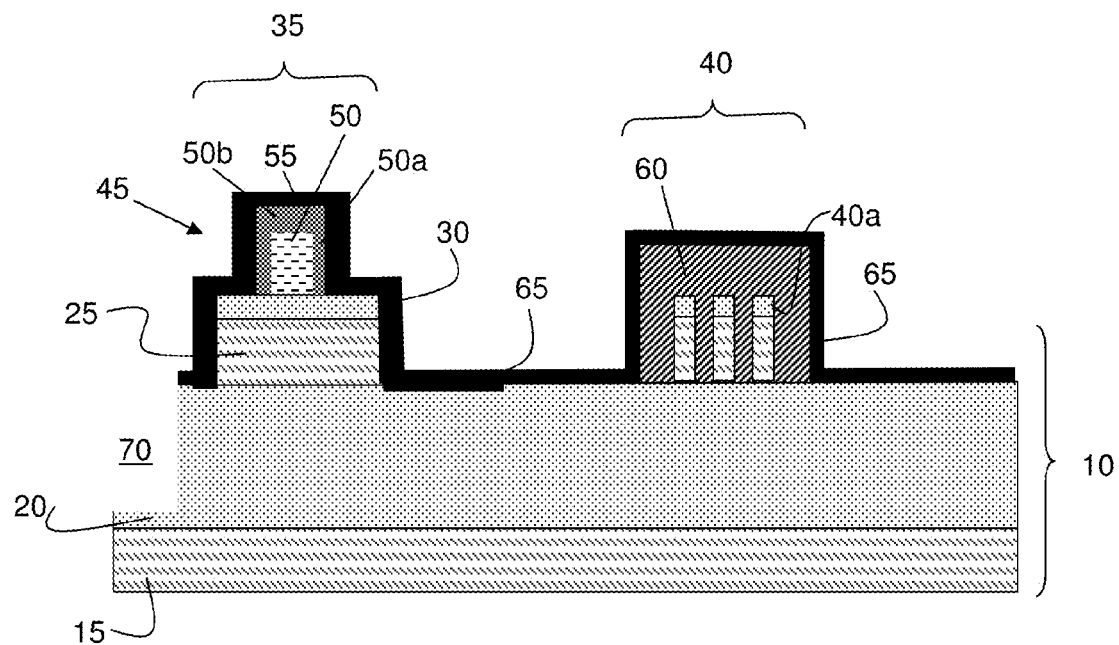

In FIG. 3, a protective liner 65 is formed over the passive device regions 35 and active device regions 40. More specifically, a blanket deposition process can be performed to line the structure of FIG. 3 with protective material. In embodiments, the protective material is a nitride material, deposited to a thickness of about 3 nm to 20 nm; although other dimensions are also contemplated by the present invention. The nitride material can be deposited using a Plasma Enhanced Atomic Layer Deposition (PEALD) process or a CVD process, as examples. In embodiments, this nitride material can be similar to the deposition processes of the nitride material 30. It should be understood by those of skill in the art that any deposition and/or growth process described herein results in an upper layer of material being in direct contact with a lower layer of material.

Still referring to FIG. 3, a recess 70 is formed in the BOX layer 20, on a side of the passive device(s) 45. In embodiments, the recess 70 will result in a partial removal of the BOX layer 20, on the side of the passive device(s) 45. This may, in embodiments, result in an exposure of at least a top surface of the layer 15.

In embodiments, the recess 70 is formed using a lithography and etching processes. For example, a resist can be formed over the structure, e.g., over the passive device regions 35 and active device regions 40, and patterned to form an opening on the side of the passive device regions 35. An etching process, e.g., RIE, is then performed to remove portions of the nitride material, e.g., nitride layers 30 and 65, and portions of the underlying BOX layer 20. In embodiments, the etching of the BOX layer 20 is a vertical etching process, e.g., anisotropic etch, which will expose a top surface of the underlying layer 15. In this way, undercutting i.e., lateral distortion of the pattern is minimized. In alternate embodiments, portions of the BOX layer 20 can remain on the layer 15, which can be exposed in subsequent processes, as discussed with regard to FIG. 4. After etching is complete, the resist can be removed using conventional oxygen ashing processes.

Figure 4:
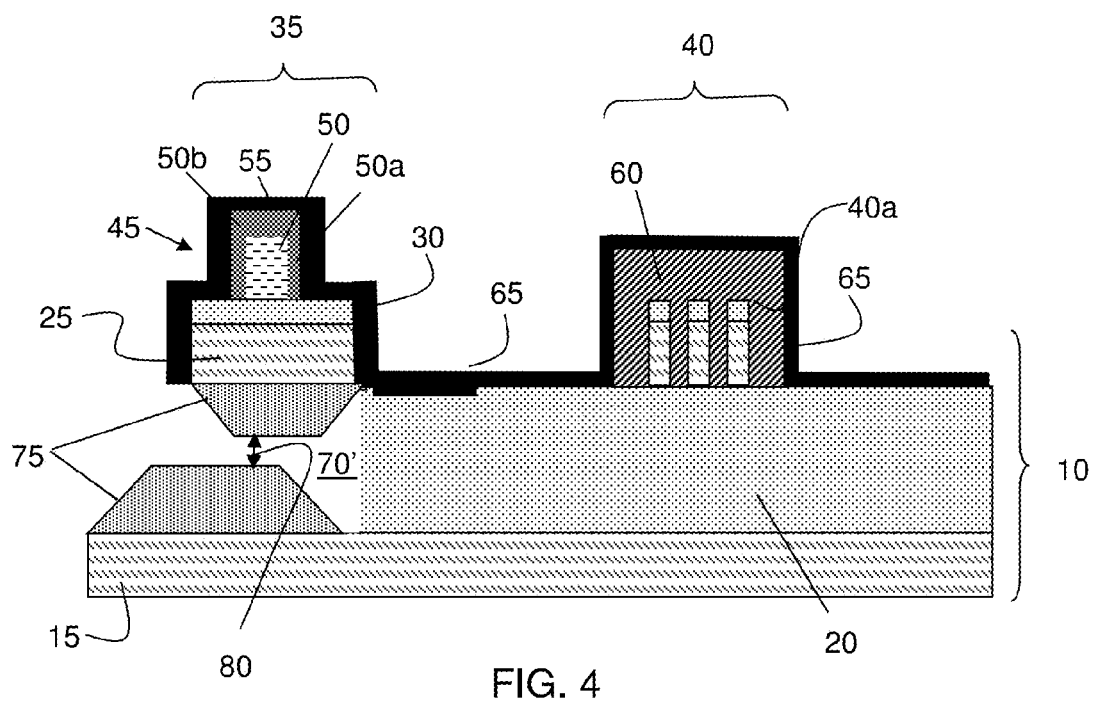

Referring now to FIG. 4, portions of the BOX layer 20 are laterally recessed to form a recess 70' under the layer 25 (forming the passive device 45). More specifically, in embodiments, portions of the BOX layer 20 are laterally removed using a wet etch chemistry of HF or, alternatively, a vapor HF process. In either removal process, the chemistry will etch vertically and laterally, exposing a bottom surface of the layer 25. In addition, although not essential for practicing of the present invention, the BOX layer 20 can be removed to expose a top surface of the layer 15.

Still referring to FIG. 4, a semiconductor layer 75 is epitaxially grown on exposed portions of the layer 25 and, if applicable, layer 15. In embodiments, the semiconductor layer 75 is Si material which can grow on exposed portions of layers 15 and 25. As should be understood by those of skill in the art, layers 15 and 25 are also semiconductor materials, e.g., Si, suitable for such growth processes. In this way, it is possible to locally thicken the semiconductor material, e.g., thicken layer 25, under the passive device(s) 45 using the processes of the present invention. Advantageously, this thickened layer will enhance heat dissipation capabilities in SOI technologies, for passive devices 45, i.e., having a thick semiconductor layer under the passive device(s) 45 will significantly improve heat conduction. In embodiments, a gap 80 can remain between the upper and lower semiconductor layers 75. Alternatively, when the layer 15 remains covered by the insulator layer 20, it is possible to either have a gap 80 between the insulator layer 20 and the thicken layer 25, or the thicken layer 25 can extend to the insulator layer 20.

Figure 5:
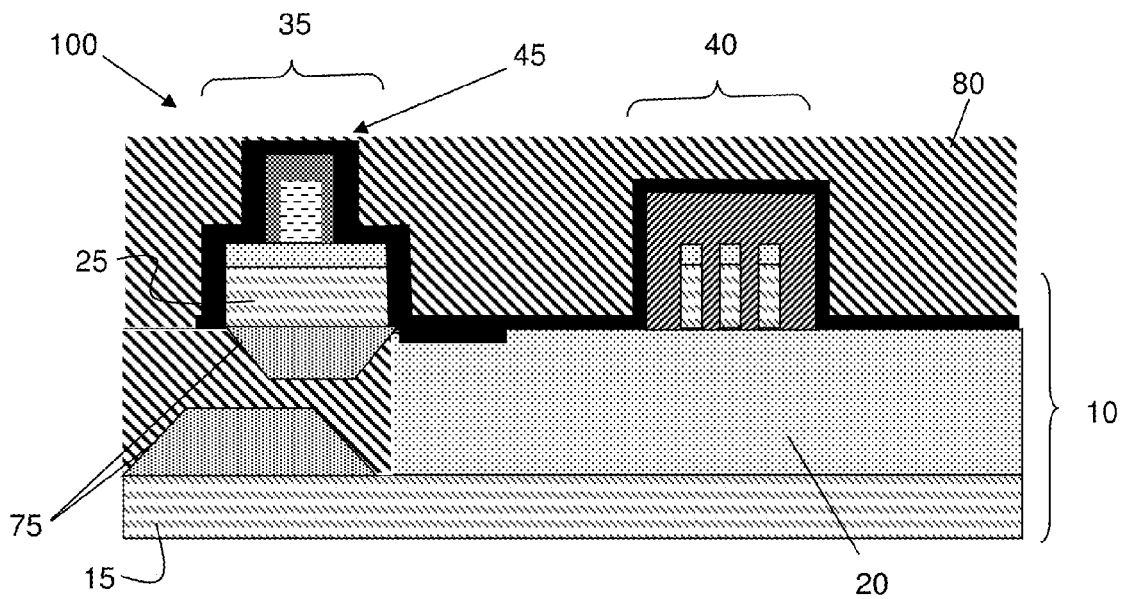
FIG. 5 shows a structure with active and passive devices, and respective processing steps in accordance with aspects of the present invention.

In FIG. 5, an oxide or other insulator material 85 fills in remaining portions of the recess 70'. In embodiments, the oxide or other insulator material 85 is also formed on any structures, e.g., passive device(s) 45 and active device(s) 40a, or other surfaces of the structure 100. In embodiments, the material 85 can be a flowable oxide, formed by a CVD process followed by a curing process. In embodiments, the curing process can be UV curing or a thermal cure, e.g., approximately 500° C.-550° C. for about two to three hours. Alternatively, the oxide can be deposited by a spin-on coating followed by a UV cure or thermal cure. Back end of the line (BEOL) processes can then continue, e.g., annealing processes, contact formation, additional device formation on upper layers, etc.

Figure 6:
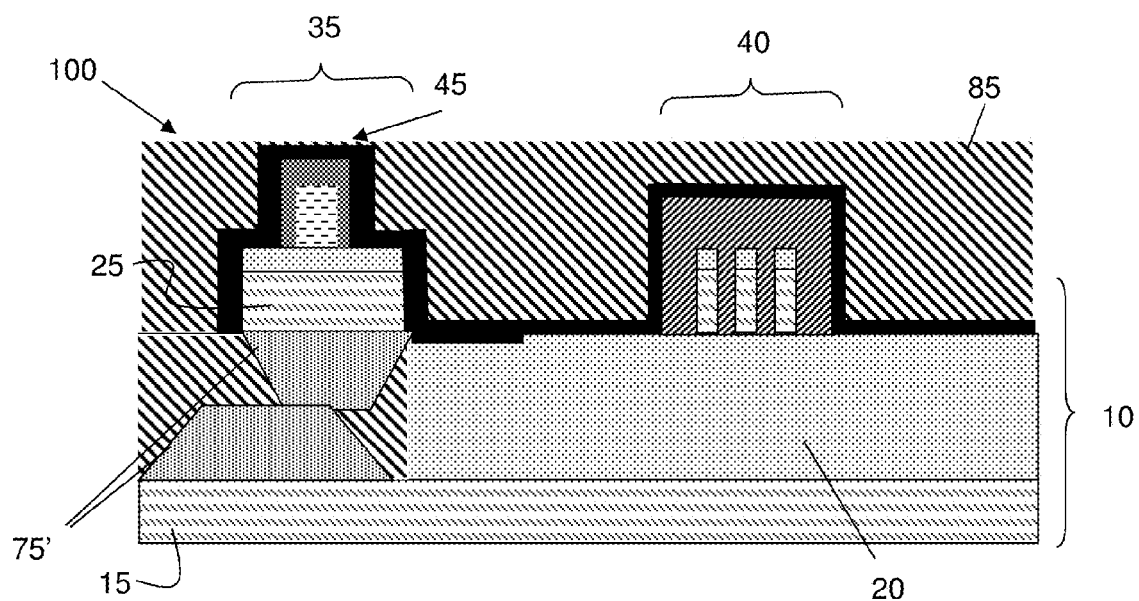
FIG. 6 shows an alternative structure with active and passive devices, and respective processing steps in accordance with aspects of the present invention.

FIG. 6 shows alternative fabrication processes and a respective structure in accordance with aspects of the present invention. In this alternative approach, the semiconductor layer 75 is epitaxially grown on exposed portions of the layer 25 (e.g., underside surface of the layer 25) and layer 15 (e.g., underside surface of the layer 15), until they are merged together. In this way, the semiconductor layer 75 is very thick, e.g., on the order of more than 1 micron, providing further enhanced heat dissipation capabilities in SOI technologies for passive devices 45. Continuing from this point, the oxide or other insulator material 85 fills in any remaining portions of the recess 70'. In embodiments, the oxide or other insulator material 85 is also formed on any structures, e.g., passive device(s) 45 and active device 40, or other surfaces of the structure 100, as discussed with regard to FIG. 5. Back end of the line (BEOL) processes can then continue, e.g., annealing processes, contact formation, additional device formation on upper layers, etc.

Figure 7:
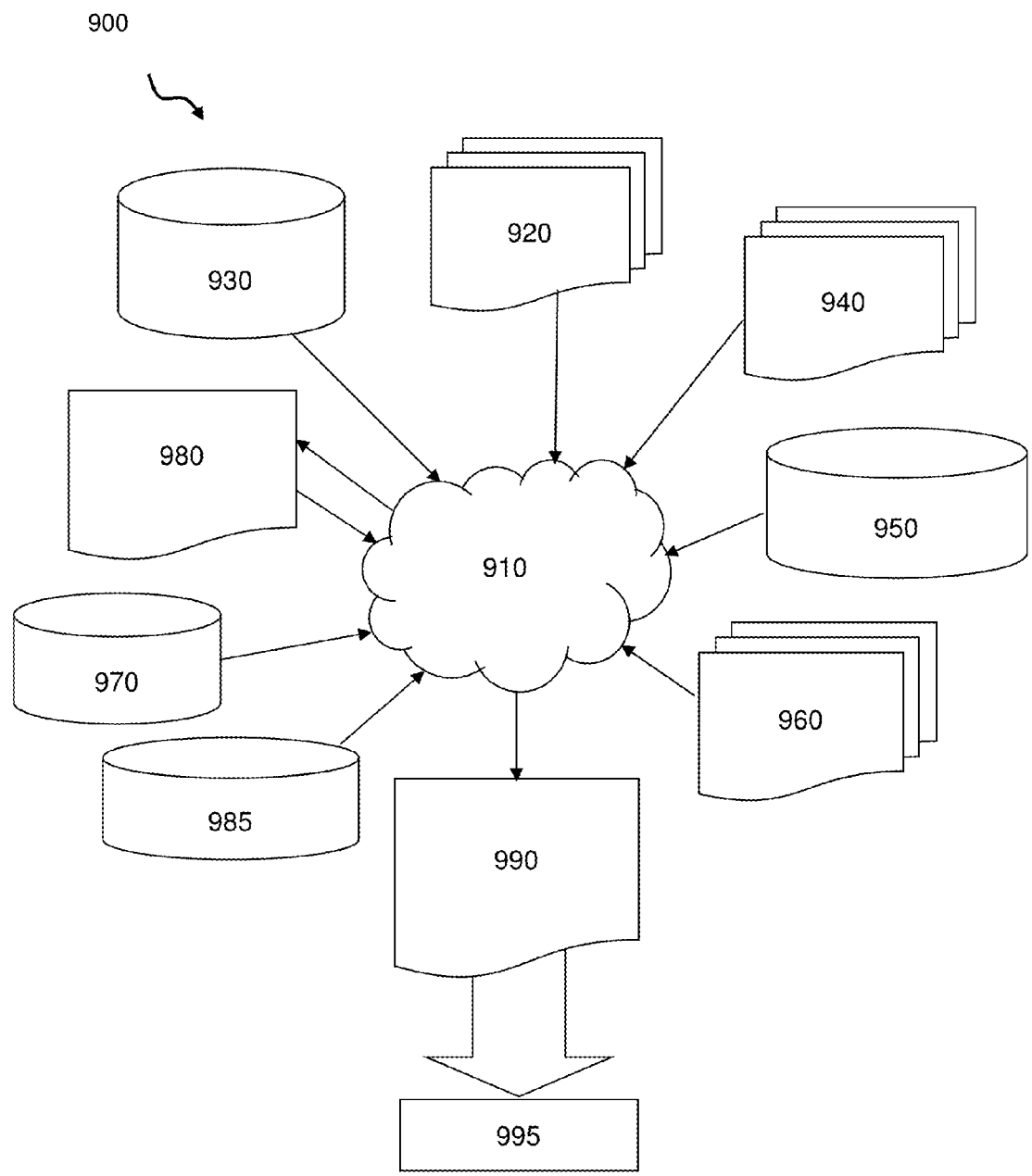
FIG. 7 is a flow diagram of a design process used in semiconductor design, manufacture, and/or test.

FIG. 7 is a flow diagram of a design process used in semiconductor design, manufacture, and/or test. FIG. 7 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-6. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-6. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-6 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-6. In one embodiment, design structure 990 may comprise a compiled, executable HDL simulation model that functionally simulates the devices shown in FIGS. 1-6.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-6. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method, comprising:
    forming a passive device on a substrate on insulator material;
    removing a portion of the insulator material to form a recess under the passive device and expose an underside surface of the substrate on insulator material; and
    forming material on the underside surface of the substrate on insulator material, thereby locally thickening the substrate on insulator material under the passive device; and
    filling any remaining portions of the recess with an insulator material.

2. The method of claim 1, wherein the substrate on insulator material is semiconductor material.

3. The method of claim 2, wherein the forming of the material is an epitaxial growth of semiconductor material.

4. The method of claim 3, wherein the semiconductor material is Si material grown on an underside of substrate on insulator material.

5. The method of claim 1, wherein the removing of the portion of the insulator material is a lateral etch of the insulator material to expose the underside surface of the substrate on insulator material.

6. The method of claim 5, wherein the lateral etch of the insulator material exposes a top surface of a substrate material under the insulator material.

7. The method of claim 6, wherein the forming of the material is an epitaxial growth of semiconductor material formed on the top surface of the substrate material and the underside surface of the substrate on insulator material.

8. The method of claim 7, wherein the forming of the material includes merging the semiconductor material from the top surface of the substrate material and the underside surface of the substrate on insulator material.

9. The method of claim 1, further comprising:
forming the insulator material over the passive device.

10. The method of claim 9, wherein the filling and the forming of the insulator material is a flowable oxide process.

11. The method of claim 1, wherein the passive device is formed partly from the substrate on insulator material.

12. The method of claim 11, wherein the passive device is formed as a diode.

13. A method, comprising:
 forming at least one passive device and at least one active device on a silicon on insulator substrate;
 removing a portion of insulator material under the at least one passive device to expose a surface of the silicon on insulator substrate, while protecting the at least one active device;
 epitaxially growing Si based material on the exposed surface of the silicon on insulator substrate; and
 flowing insulator material over exposed surfaces of the epitaxially grown Si based material, the at least one passive device and the at least one active device.

14. The method of claim 13, wherein the epitaxially growing Si based material locally thickens the silicon on insulator substrate under the at least one passive device.

15. The method of claim 13, wherein:
 the removing of the portion of the insulator material comprises exposing a surface of an underlying substrate material; and
 the epitaxially growing Si based material comprises growing the Si based material on the exposed surface of the underlying substrate material.

16. The method of claim 15, wherein the epitaxially growing Si based material comprises merging the grown Si based material from the exposed surface of the underlying substrate material and the exposed surface of the silicon on insulator substrate.

17. The method of claim of claim 13, wherein the at least one passive device is a diode.

18. A method comprising:
 forming at least one passive device; and
 increasing heat dissipation of a substrate material under the at least one passive device by locally thickening the substrate material with additional substrate material from an underside surface of the substrate material,
 wherein the substrate material is a silicon on insulator material forming part of the at least one passive device, the additional substrate material is an epitaxially grown semiconductor material formed on the underside of the silicon on insulator material, and further comprising adding insulator material on the underside of the at least one passive device.

* * * * *